US012571626B2

(12) United States Patent
Kaneko et al.

(10) Patent No.: US 12,571,626 B2
(45) Date of Patent: Mar. 10, 2026

(54) METHOD FOR MEASURING ETCHING AMOUNT, AND MEASUREMENT SYSTEM THEREFOR

(71) Applicants: KWANSEI GAKUIN EDUCATIONAL FOUNDATION, Hyogo (JP); TOYOTA TSUSHO CORPORATION, Aichi (JP)

(72) Inventors: Tadaaki Kaneko, Hyogo (JP); Kiyoshi Kojima, Tokyo (JP)

(73) Assignees: KWANSEI GAKUIN EDUCATIONAL FOUNDATION, Hyogo (JP); TOYOTA TSUSHO CORPORATION, Aichi (JP)

( * ) Notice: Subject to any disclaimer, the term of this patent is extended or adjusted under 35 U.S.C. 154(b) by 237 days.

(21) Appl. No.: 18/261,621

(22) PCT Filed: Jan. 7, 2022

(86) PCT No.: PCT/JP2022/000407
§ 371 (c)(1),
(2) Date: Jul. 14, 2023

(87) PCT Pub. No.: WO2022/153951
PCT Pub. Date: Jul. 21, 2022

(65) Prior Publication Data
US 2024/0328776 A1 Oct. 3, 2024

(30) Foreign Application Priority Data
Jan. 14, 2021 (JP) ................................. 2021-004577

(51) Int. Cl.
*G01B 11/06* (2006.01)
*G01N 21/3563* (2014.01)
(Continued)

(52) U.S. Cl.
CPC ......... *G01B 11/06* (2013.01); *G01N 21/3563* (2013.01); *G01N 21/65* (2013.01);
(Continued)

(58) Field of Classification Search
CPC ................ G01B 11/06; G01B 2210/56; G01N 21/3563; G01N 21/65; G01N 2021/3568;
(Continued)

(56) References Cited

U.S. PATENT DOCUMENTS

2002/0127820 A1* 9/2002 Sato .................. H01L 21/02661
257/E21.123
2018/0226246 A1* 8/2018 Hamano ........... H01L 21/02529
(Continued)

FOREIGN PATENT DOCUMENTS

| CN | 102303953 A | 1/2012 |
|---|---|---|
| JP | 2005-297129 A | 10/2005 |

(Continued)

OTHER PUBLICATIONS

EPO Communication and European Search Report issued in EP Application No. 22739360.0 on Nov. 5, 2024.
(Continued)

*Primary Examiner* — Duy Vu N Deo
(74) *Attorney, Agent, or Firm* — Calfee, Halter & Griswold LLP

(57) ABSTRACT

The present invention addresses the problem of providing a novel technology for measuring an etching amount in heat treatment in which growth and etching proceed simultaneously. The present invention includes: a first substrate thickness measuring step S10 for measuring the thickness 10D of a to-be-heat-treated semiconductor substrate 10; a second substrate thickness measuring step S20 for measuring the thickness 20D of a heat-treated semiconductor substrate 20; a growth layer thickness measuring step S30 for measuring
(Continued)

the thickness 21D of a growth layer 21 which has gone through crystal growth by heat treatment; and an etching amount calculating step S40 for calculating the etching amount ED on the basis of the thickness 10D of the to-be-heat-treated semiconductor substrate 10, the thickness 20D of the heat-treated semiconductor substrate 20, and the thickness 21D of the growth layer 21.

6 Claims, 4 Drawing Sheets

(51) Int. Cl.
| | |
|---|---|
| *G01N 21/65* | (2006.01) |
| *C30B 33/02* | (2006.01) |
| *C30B 33/08* | (2006.01) |
| *G01N 21/35* | (2014.01) |

(52) U.S. Cl.
CPC .............. *C30B 33/02* (2013.01); *C30B 33/08* (2013.01); *G01B 2210/56* (2013.01); *G01N 2021/3568* (2013.01); *G01N 2021/3595* (2013.01)

(58) Field of Classification Search
CPC ............ G01N 2021/3595; C30B 33/02; C30B 33/08; C30B 33/12; C30B 29/36; H01L 21/3212; H01L 22/12; H01L 22/20

USPC .................................................. 438/689–714
See application file for complete search history.

(56) References Cited

U.S. PATENT DOCUMENTS

| | | | |
|---|---|---|---|
| 2019/0240799 A1 | 8/2019 | Takeda et al. | |
| 2022/0178048 A1* | 6/2022 | Kaneko | ............ H01L 21/02529 |
| 2022/0181156 A1 | 6/2022 | Kaneko | |

FOREIGN PATENT DOCUMENTS

| | | | |
|---|---|---|---|
| JP | 2011-14800 A | 1/2011 | |
| JP | 2011-23422 A | 2/2011 | |
| JP | 2019-16713 A | 1/2019 | |
| TW | 202033829 A | 9/2020 | |
| WO | 2020179795 A1 | 9/2020 | |
| WO | WO-2020218484 A1 * | 10/2020 | ............ G01K 13/12 |

OTHER PUBLICATIONS

English translation of International Search Report from PCT/JP2022/000407 dated Mar. 29, 2022 (2 pages).

* cited by examiner

METHOD FOR MEASURING ETCHING AMOUNT, AND MEASUREMENT SYSTEM THEREFOR

CROSS-REFERENCE TO RELATED APPLICATIONS

This application is a 371 of PCT Application No. PCT/JP2022/000407, filed Jan. 7, 2022, which claims priority to Japanese Application No. 2021-004577, filed on Jan. 14, 2021, the contents of which are hereby incorporated by reference as if recited in their entirety.

TECHNICAL FIELD

The present invention relates to a method for measuring an etching amount of a semiconductor substrate and a measurement system therefor.

BACKGROUND ART

Conventionally, a process of manufacturing a semiconductor device includes a polishing step of polishing a surface of a semiconductor substrate (so-called wafer) to obtain a surface suitable for manufacturing the device. In this polishing step, when both surfaces (for example, upper and lower surfaces) of the wafer need to be polished, an industrially beneficial double-sided polishing method can be adopted.

Normally, when polishing a semiconductor substrate, it is necessary to accurately measure the thickness of the substrate for quality control. However, in the double-sided polishing method of simultaneously polishing both surfaces of a wafer, there is a problem that it is difficult to measure the polishing amount for each polished surface.

In view of such a problem, various methods for accurately measuring the polishing amounts of both surfaces of a wafer have been proposed. For example, Patent Literature 1 discloses a technique of "a measurement method for a polishing amount when both surfaces of a flat plate-shaped substrate are simultaneously polished, the measurement method including calculating a polishing amount for each surface from a change amount between before and after polishing, of a chamfered shape applied in advance to an end surface of the substrate".

In addition, as an alternative technique to polishing, a technique of etching a wafer by heat treatment has been proposed. For example, Patent Literature 2 discloses a technique of "a method of manufacturing a SiC substrate, the method including simultaneously performing a growth step of forming a growth layer on one surface of a SiC base substrate and an etching step of etching the other surface of the SiC base substrate".

CITATION LIST

Patent Literature

Patent Literature 1: JP 2005-297129 A
Patent Literature 2: WO 2020/179795 A

SUMMARY OF INVENTION

Technical Problem

Incidentally, in the measurement method described in Patent Literature 1, the polishing amount is calculated from the chamfered shape applied to the end surface of the semiconductor substrate. Therefore, there is a problem that the accuracy of measurement decreases as the distance from the end surface of the substrate increases. That is, at a position away from the end surface serving as a reference of the change amount between before and after polishing (for example, the vicinity of the center of the substrate or the like), uniformity of the polishing amount for each polishing position and the influence of warpage of the substrate are reflected. Therefore, it has been difficult to ensure the accuracy of the measurement of the polishing amount.

In addition, Patent Literature 2 discloses a technique in which, by heat-treating a semiconductor substrate, one surface of the semiconductor substrate is grown and the other surface is etched. In order to mass-produce semiconductor substrates by adopting such a thermal etching method, it is necessary to confirm whether or not the etching amount is accurately controlled from the viewpoint of quality assurance. However, there is a problem that a method for measuring the etching amount in a case where the growth and etching of the semiconductor substrate proceed simultaneously has not been established. In view of the above-described problems, an object of the present invention is to provide a novel technique for measuring an etching amount in heat treatment in which growth and etching of a semiconductor substrate proceed simultaneously.

Another object of the present invention is to provide a novel technique for measuring an etching amount of a semiconductor substrate over a wide range of the entire surface of a semiconductor substrate in a non-destructive and accurate manner.

Solution to Problem

The present invention to solve the above-described problems is a method for measuring an etching amount, the method including: a first substrate thickness measuring step of measuring a thickness of a semiconductor substrate before heat treatment; a second substrate thickness measuring step of measuring the thickness of the semiconductor substrate after the heat treatment; a growth layer thickness measuring step of measuring a thickness of a growth layer whose crystal has been grown by the heat treatment; and an etching amount calculating step of calculating the etching amount on a basis of the thickness of the semiconductor substrate before the heat treatment, the thickness of the semiconductor substrate after the heat treatment, and the thickness of the growth layer.

In a preferred embodiment of the present invention, the etching amount calculating step is a step of adding the thickness of the growth layer to the thickness of the semiconductor substrate before the heat treatment and further subtracting the thickness of the semiconductor substrate after the heat treatment therefrom.

A preferred embodiment of the present invention further includes a heat treatment step of, by the heat treatment, forming the growth layer on one surface of the semiconductor substrate and etching another surface thereof.

In a preferred embodiment of the present invention, the etching amount calculating step is a step of setting a plurality of arbitrary areas obtained by partitioning the semiconductor substrate by an arbitrary size and calculating an etching amount for each of the arbitrary areas.

In a preferred embodiment of the present invention, the growth layer thickness measuring step is a step of measuring the thickness of the growth layer using Fourier transform infrared spectroscopy.

In a preferred embodiment of the present invention, the growth layer thickness measuring step is a step of measuring the thickness of the growth layer using Raman spectroscopy.

In a preferred embodiment of the present invention, the semiconductor substrate is silicon carbide.

In addition, the present invention also relates to a measurement system for an etching amount, which causes a processor of a computer to execute the measuring method described above.

Advantageous Effects of Invention

According to the disclosed technology, it is possible to provide a novel technique for measuring an etching amount in heat treatment in which growth and etching of a semiconductor substrate proceed simultaneously.

In addition, according to the disclosed technology, it is possible to provide a novel technique for measuring an etching amount of a semiconductor substrate over a wide range of the entire surface of a semiconductor substrate in a non-destructive and accurate manner.

Other problems, features, and advantages will become apparent from a reading of the following description of embodiments when taken in conjunction with the drawings and claims.

DESCRIPTION OF EMBODIMENTS

Figure 1:
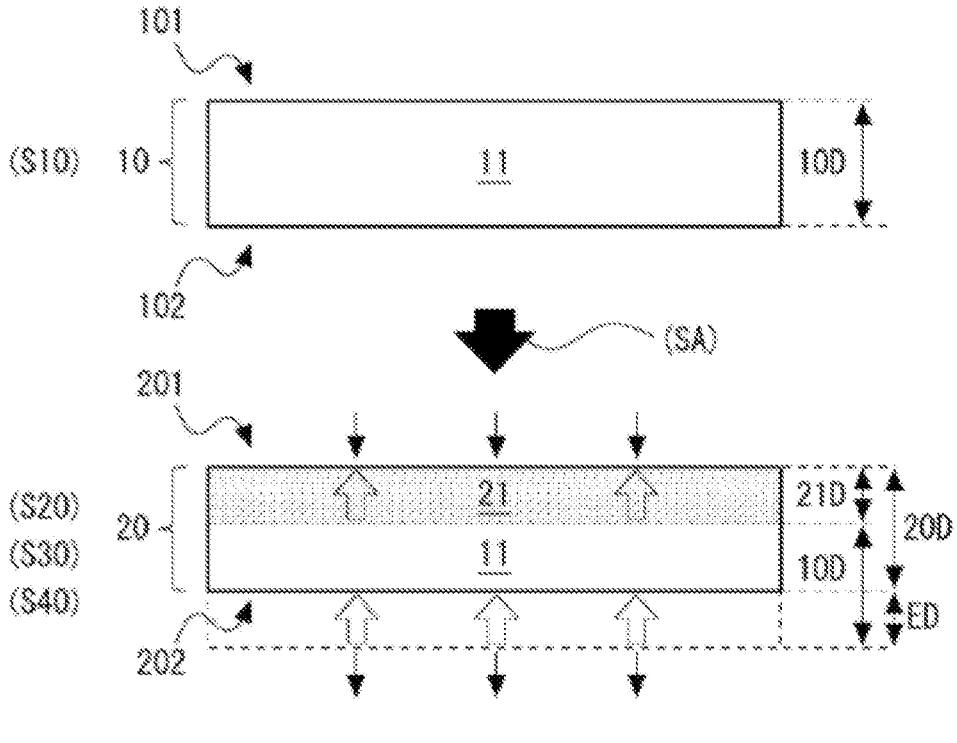
FIG. 1 is an explanatory diagram illustrating a method for measuring an etching amount according to an embodiment.

Hereinafter, a preferred embodiment of a method for measuring an etching amount and a measurement system for an etching amount according to the present invention will be described in detail with reference to the accompanying drawings. The technical scope of the present invention is not limited to the embodiment illustrated in the accompanying drawings, and can be appropriately changed within the scope described in the claims. To be noted, in the following description of the embodiment and the accompanying drawings, the same reference numerals are given to the same elements, and redundant description is omitted.

The method for measuring the etching amount according to the present invention includes a first substrate thickness measuring step S10 of measuring a thickness 10D of a semiconductor substrate 10 before heat treatment, a second substrate thickness measuring step S20 of measuring a thickness 20D of a semiconductor substrate 20 after the heat treatment, a growth layer thickness measuring step S30 of measuring a thickness 21D of a growth layer 21 whose crystal has been grown by the heat treatment, and an etching amount calculating step S40 of calculating an etching amount ED on the basis of the thickness 10D of the semiconductor substrate 10 before the heat treatment, the thickness 20D of the semiconductor substrate 20 after the heat treatment, and the thickness 21D of the growth layer 21.

The method for measuring the etching amount according to the embodiment may further include a heat treatment step SA of, by heat treatment, forming the growth layer 21 on one surface of the semiconductor substrate 10 and etching the other surface. In this heat treatment step SA, the crystal growth and the etching proceed simultaneously.

Examples of the semiconductor substrate 10 include substrates formed from compound semiconductor materials such as a silicon carbide (SiC) substrate, a gallium nitride (GaN) substrate, and an aluminum nitride (AlN) substrate. In addition, the diameter of the semiconductor substrate 10 to be measured is not limited, but is characterized in that a large-diameter substrate can be measured. Therefore, the semiconductor substrate 10 is preferably 4 inches or more, more preferably 6 inches or more, and still more preferably 8 inches or more.

FIG. 1 is an explanatory diagram illustrating a method for measuring an etching amount according to the embodiment.

On the front surface 101 side of the semiconductor substrate 10, crystal growth proceeds by being supplying with atoms for growth in the heat treatment step SA, and the growth layer 21 is formed on a bulk layer 11. Therefore, the thickness 21D of the growth layer 21 is from the front surface 101 of the semiconductor substrate 10 before the heat treatment to a front surface 201 of the growth layer 21.

In addition, on the back surface 102 side of the semiconductor substrate 10, etching of the bulk layer 11 proceeds as atoms constituting the semiconductor substrate are separated from the surface in the heat treatment step SA. Therefore, the etching amount ED is from the back surface 102 of the semiconductor substrate 10 before the heat treatment to a back surface 202 of the semiconductor substrate 20 after the heat treatment.

Hereinafter, each step will be described in detail according to an embodiment of the present invention.

<First Substrate Thickness Measuring Step S10>

The first substrate thickness measuring step S10 is a step of measuring the thickness 10D of the semiconductor substrate 10 before the heat treatment step SA. In the first substrate thickness measuring step S10, it is desirable to acquire measurement position information of the semiconductor substrate 10 and thickness 10D information corresponding to the measurement position information.

The first substrate thickness measuring step S10 can be adopted as long as it is a method capable of acquiring the thickness 10D information and the measurement position information of the semiconductor substrate 10.

Specifically, a micrometer (contact displacement meter), a thickness measuring instrument of an electrostatic capacity type, and thickness measurement of a light transmission type or spectral interference type using a laser can be exemplified.

<Heat Treatment Step SA>

The heat treatment step SA is a step of, by heat treatment, simultaneously forming the growth layer 21 on one surface of the semiconductor substrate 10 and etching the other surface. As a method of the heat treatment step SA, a method of manufacturing a SiC substrate described in Patent Literature 2 (WO 2020/179795 A) can be exemplified. Hereinafter, an example of the heat treatment step SA according to the embodiment will be described in detail with reference to FIGS. 2 and 3.

Figure 2:
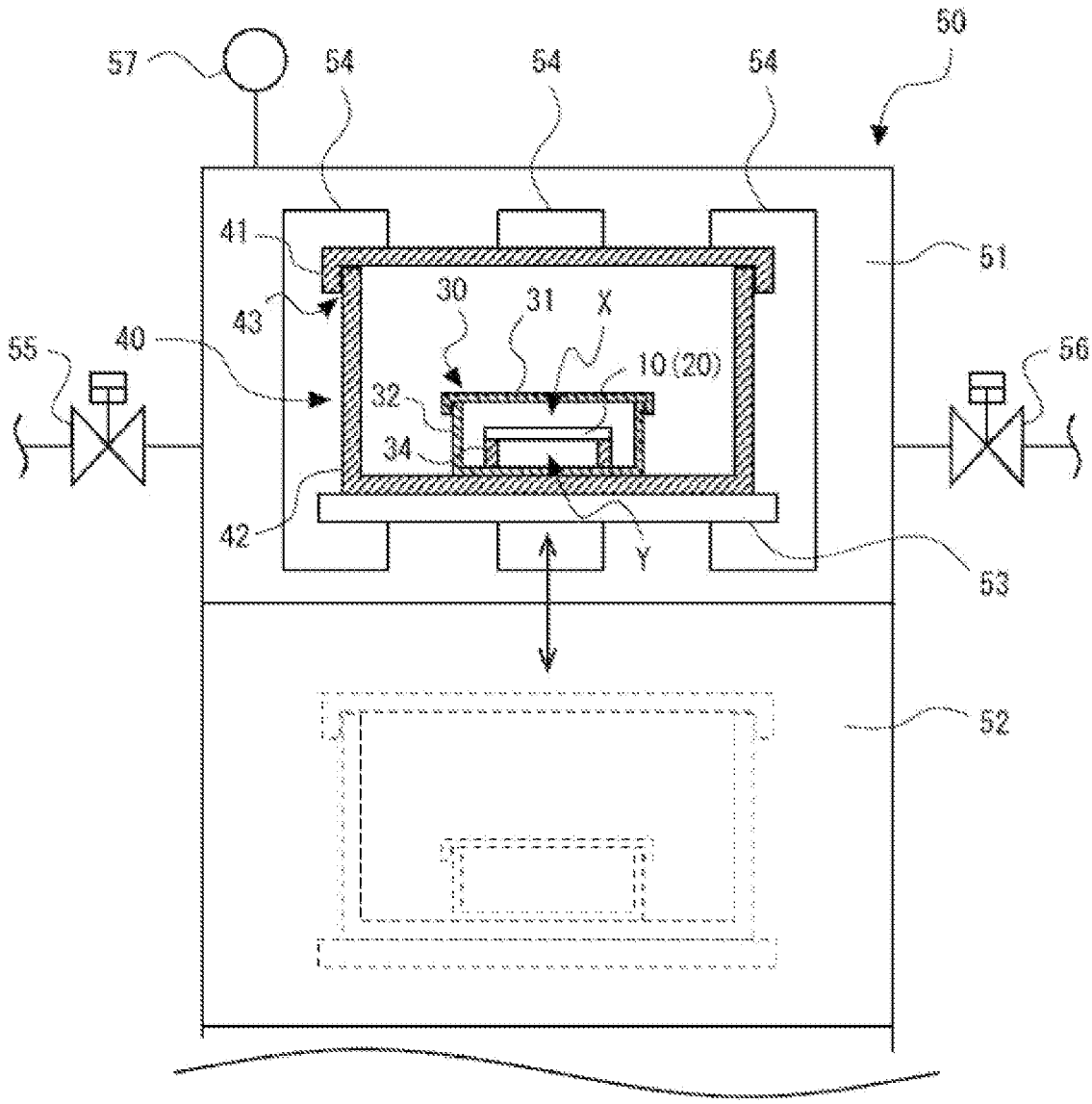
FIG. 2 is an explanatory diagram for describing a heat treatment apparatus used in a heat treatment step according to the embodiment.
Figure 3:
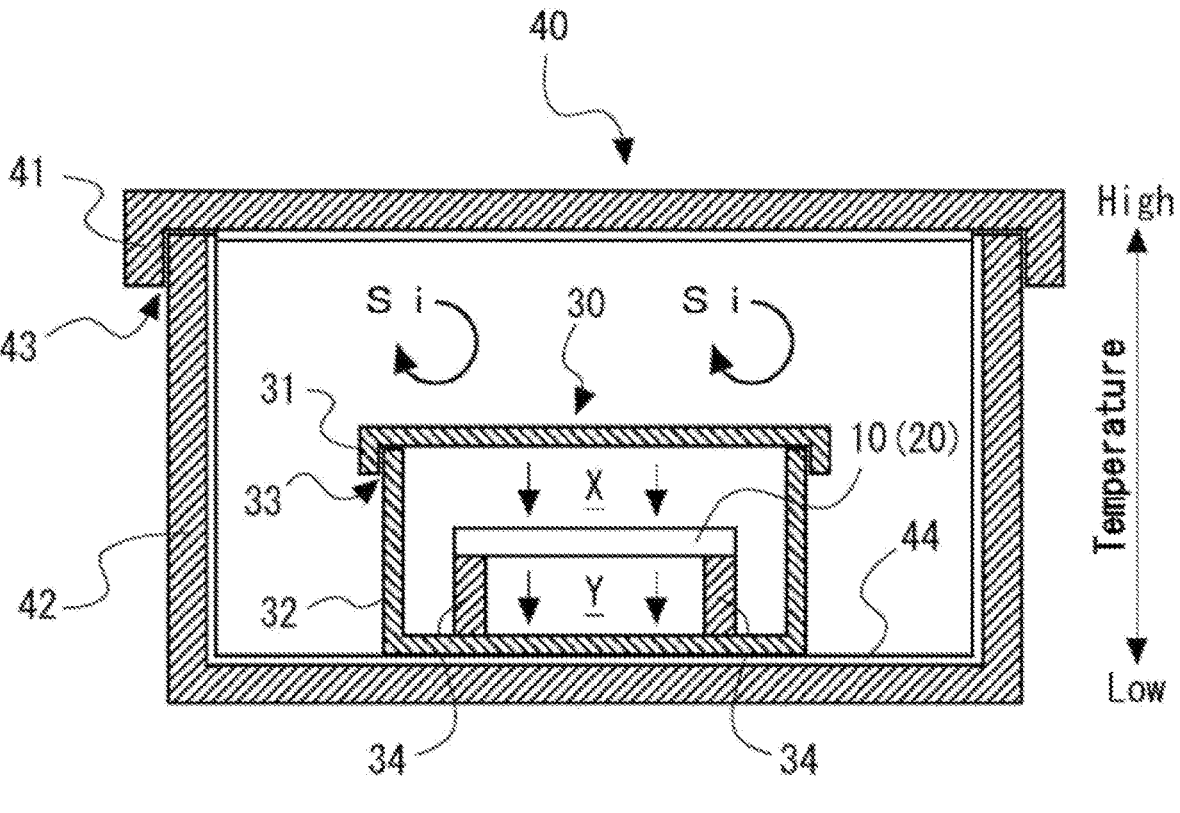
FIG. 3 is an explanatory diagram for describing the heat treatment step according to the embodiment.

FIGS. 2 and 3 are explanatory diagrams for describing the heat treatment step SA according to the embodiment. FIG. 2 illustrates an example of a heat treatment apparatus used in the heat treatment step SA. FIG. 3 illustrates a state in which the growth layer 21 is formed on one surface of the semiconductor substrate 10 subjected to the heat treatment, and at the same time, the other surface is etched.

As illustrated in FIG. 2, the heat treatment apparatus includes a main body container 30 capable of housing the semiconductor substrate 10, a high melting point container 40 capable of housing the main body container 30, and a heating furnace 50 capable of forming a temperature gradient in the main body container 30.

(Main Body Container)

The main body container 30 is a fitting container including an upper container 31 and a lower container 32 that can be fitted to each other. A minute gap 33 is formed in a fitting portion between the upper container 31 and the lower container 32, and the inside of the main body container 30 can be exhausted (evacuated) from the gap 33. The main body container 30 is formed from, for example, the same material as the semiconductor substrate 10.

In addition, a substrate holder 34 is disposed between the semiconductor substrate 10 and the lower container 32 to form a space under the semiconductor substrate 10. The substrate holder 34 forms a crystal growth space X in which crystal growth of the growth layer 21 proceeds, and an etching space Y in which etching proceeds, above and below the semiconductor substrate 10.

The crystal growth space X and the etching space Y are spaces in which crystal growth or etching proceed using the temperature gradient formed in the main body container 30 as a driving force. That is, the crystal growth space X is a space for transporting a raw material from the main body container 30 to the semiconductor substrate 10 by the temperature gradient formed in the main body container 30. In addition, the etching space Y is a space for transporting a raw material from the semiconductor substrate 10 to the main body container 30 by the temperature gradient formed in the main body container 30.

(High Melting Point Container)

Similarly to the main body container 30, the high melting point container 40 is a fitting container including an upper container 41 and a lower container 42 that can be fitted to each other, and is configured to be able to house the main body container 30. A minute gap 43 is formed in a fitting portion between the upper container 41 and the lower container 42, and the inside of the high melting point container 40 can be exhausted (evacuated) from the gap 43.

The high melting point container 40 contains a high melting point material. Examples thereof include C, which is a general-purpose heat resistant member, W, Re, Os, Ta, and Mo which are high melting point metals, $Ta_9C_8$, HfC, TaC, NbC, ZrC, $Ta_2C$, TiC, WC, and MOC which are carbides, HEN, TaN, BN, $Ta_2N$, ZrN, and TiN which are nitrides, $HfB_2$, $TaB_2$, $ZrB_2$, $NB_2$, and $TiB_2$ which are borides, and polycrystalline SiC.

The high melting point container 40 preferably includes a vapor supply source 44 capable of supplying vapor pressure of gas species containing an element of the semiconductor substrate 10 into the high melting point container 40. The vapor supply source 44 may be configured to generate vapor in the high melting point container 40 when heated, and for example, in a case where a SiC substrate is heat-treated, solid Si (Si pellet such as a single crystal Si piece or Si powder) or a Si compound can be exemplified.

(Heating Furnace)

The heating furnace 50 includes a main heating chamber 51 capable of heating a processing target to a temperature of 1000° C. or higher and 2300° C. or lower, a preheating chamber 52 capable of preheating the processing target to a temperature of 500° C. or higher, a moving means 53

(moving table) capable of moving the processing target from the preheating chamber 52 to the main heating chamber 51, and a heating heater 54. In addition, a vacuum forming valve 55 for exhausting the inside of the main heating chamber 51, an inert gas injection valve 56 for introducing an inert gas into the main heating chamber 51, a vacuum gauge 57 for measuring the degree of vacuum in the main heating chamber 51, and the like may be connected to the main heating chamber 51.

The heating furnace 50 is configured to be able to form a temperature gradient in the main body container 30. For example, a temperature gradient can be formed in the high melting point container 40 (and in the main body container 30) by releasing minute heat from a contact portion between the high melting point container 40 and a moving means 53 (moving table).

In addition, a configuration in which a temperature gradient is formed by the heating heater 54 may be adopted. For example, a configuration in which a large number of heating heaters 54 are disposed in an upper portion of the main heating chamber 51 may be adopted. In addition, a configuration in which the width of the heater or output of the heater increase toward the upper portion of the main heating chamber 51 may be adopted. Alternatively, a configuration in which power to be supplied is increased toward the upper portion of the main heating chamber 51 may be adopted.

<Second Substrate Thickness Measuring Step S20>

The second substrate thickness measuring step S20 is a step of measuring the thickness 20D of the semiconductor substrate 20 after the heat treatment step SA. In the second substrate thickness measuring step S20, similarly to the first substrate thickness measuring step S10, it is desirable to acquire measurement position information of the semiconductor substrate 20 and thickness 20D information corresponding to the measurement position information. In addition, in the second substrate thickness measuring step S20, the same means as in the first substrate thickness measuring step S10 can be adopted.

<Growth Layer Thickness Measuring Step S30>

The growth layer thickness measuring step S30 is a step of measuring the thickness 21D of the growth layer 21 whose crystal has been grown in the heat treatment step SA. In the growth layer thickness measuring step S30, it is desirable to acquire measurement position information of the semiconductor substrate 20 and thickness 21D information corresponding to the measurement position information.

The growth layer thickness measuring step S30 can be adopted as long as it is a method capable of nondestructively acquiring the thickness 21D information of the growth layer 21. Specifically, Fourier transform infrared spectroscopy (so-called FTIR) and Raman spectroscopy can be exemplified. As another method for measuring the thickness of the growth layer, there are methods such as SIMS and cross-sectional SEM, but these methods are destructive inspection, which makes the semiconductor substrate unusable for device manufacturing thereafter, and therefore cannot be adopted. In addition, these methods take labor and cost, and therefore are not suitable for mass production.

In the growth layer thickness measuring step S30, the carrier concentration originating from nitrogen in the growth layer 21 can be measured simultaneously with the thickness 21D of the growth layer 21 by employing Raman spectroscopy.

<Etching Amount Calculating Step S40>

The etching amount calculating step S40 is a step of calculating the etching amount ED on the basis of the thickness 10D of the semiconductor substrate 10 before the heat treatment, the thickness 20D of the semiconductor substrate 20 after the heat treatment, and the thickness 21D of the growth layer 21.

Specifically, the etching amount calculating step S40 is a step of adding the thickness 21D of the growth layer 21 to the thickness 10D of the semiconductor substrate 10 before the heat treatment, and further subtracting the thickness 20D of the semiconductor substrate 20 after the heat treatment therefrom.

The thickness 10D of the semiconductor substrate 10 before the heat treatment, the thickness 20D of the semiconductor substrate 20 after the heat treatment, and the thickness 21D of the growth layer 21 are thickness information associated with measurement position information. By performing the addition process and the subtraction process described above for each measurement position of the semiconductor substrate 10 (20), the etching amount ED at each measurement position of the semiconductor substrate 10 can be calculated.

In addition, the etching amount calculating step S40 may be a step of setting a plurality of arbitrary areas AA obtained by partitioning the semiconductor substrate 10 (20) by an arbitrary size and calculating the etching amount ED for each arbitrary area AA.

Figure 4:
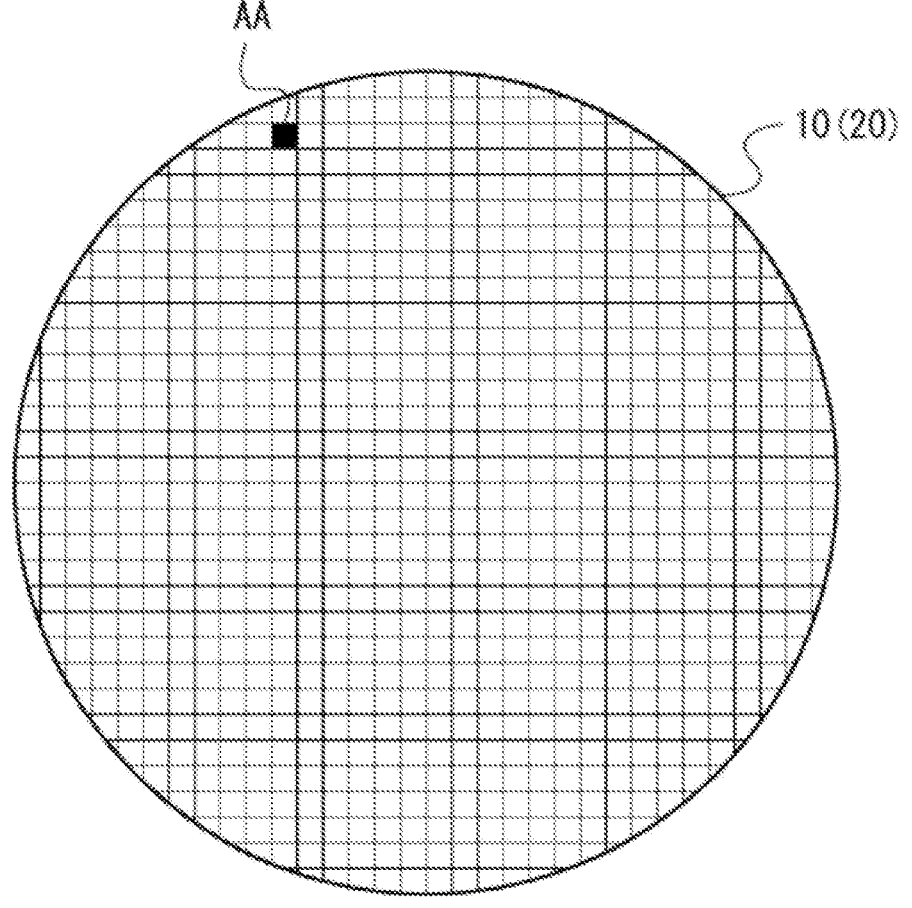
FIG. 4 is an explanatory diagram illustrating an example of an arbitrary area of the method for measuring the etching amount according to the embodiment.

FIG. 4 is an explanatory diagram illustrating an example of an arbitrary area AA in the method for measuring the etching amount according to the embodiment. That is, the statistic of each thickness may be calculated for each set arbitrary area AA, and the addition processing and the subtraction processing may be performed on the basis of the statistic of the arbitrary area AA. Note that, as the statistic, an average value, a median value, a mode value, or the like can be adopted.

Further, although the rectangular arbitrary areas AA are set in a lattice arrangement in FIG. 4, an arbitrary shape and size can be set. For example, fan-shaped arbitrary areas AA can be set on a concentric circle.

According to the method for measuring the etching amount according to the present invention, the etching amount ED can be accurately measured in the heat treatment in which the crystal growth and the etching of the semiconductor substrate 10 proceed simultaneously. As a result, it is possible to monitor whether or not the heat treatment environment of the semiconductor substrate is controlled as intended.

In addition, according to the method for measuring the etching amount according to the present invention, the etching amount of the semiconductor substrate can be accurately measured in a wide range. For example, in a case where a reference is provided on an end surface of the substrate as in Patent Literature 1 (JP 2005-297129 A), there is a problem that the accuracy of measurement decreases as the distance from the end surface increases.

In this regard, according to the method for measuring the etching amount according to the present invention, since the etching amount ED is calculated on the basis of the thickness information associated with the measurement position information of the semiconductor substrate, the etching amount ED can be calculated with the same accuracy regardless of the position of the semiconductor substrate. In other words, it is possible to provide a measurement result of the etching amount ED not biased in the circumferential direction and the radial direction in the wafer plane. This function becomes more important as the wafer becomes larger in diameter, for example, from 4 inches to 6 inches, and from 6 inches to 8 inches. This is because, in general, when the diameter is larger, it is more difficult to uniformly control etching and growth over the entire surface of the semiconductor substrate, and thus, the measurement value for each position in the plane has extremely important meaning for PDCA in process development and also for quality assurance.

In addition, the measuring means of the first substrate thickness measuring step S10, the measuring means of the second substrate thickness measuring step S20, the measuring means of the growth layer thickness measuring step S30, and the calculating means of the etching amount calculating step S40 may be configured to be able to communicate with each other via a local area network or the like.

In addition, the calculating means of the etching amount calculating step S40 may adopt a hardware configuration such as a processor or a storage, and may constitute the measurement system for an etching amount, which causes a processor of a computer to execute the above-described method for measuring the etching amount.

REFERENCE SIGNS LIST

10 Semiconductor substrate before heat treatment
11 Bulk layer
20 Semiconductor substrate after heat treatment
21 Growth layer
30 Main body container
31 Upper container
32 Lower container
33 Gap
34 Substrate holder
40 High melting point container
41 Upper container
42 Lower container
43 Gap
44 Vapor supply source
50 Heating furnace
51 Main heating chamber
52 Preheating chamber
53 Moving means
54 Heating heater
55 Vacuum forming valve
56 Inert gas injection valve
57 Vacuum gauge
X Crystal growth space
Y Etching space
S10 First substrate thickness measuring step
S20 Second substrate thickness measuring step
S30 Growth layer measuring step
S40 Etching amount measuring step
SA Heat treatment step
ED Etching amount

The invention claimed is:

1. A method for manufacturing a SiC substrate, the method comprising:

a heat treatment step of forming a growth layer on one surface of a semiconductor substrate and etching another surface thereof;

a first substrate thickness measuring step of measuring a thickness of the semiconductor substrate before the heat treatment;

a second substrate thickness measuring step of measuring the thickness of the semiconductor substrate after the heat treatment;

a growth layer thickness measuring step of measuring a thickness of a growth layer whose crystal has been grown by the heat treatment; and an etching amount calculating step of calculating the etching amount on a basis of the thickness of the semiconductor substrate before the heat treatment, the thickness of the semiconductor substrate after the heat treatment, and the thickness of the growth layer.

2. The method according to claim 1, wherein the etching amount calculating step is a step of adding the thickness of the growth layer to the thickness of the semiconductor substrate before the heat treatment and further subtracting the thickness of the semiconductor substrate after the heat treatment therefrom.

3. The method according to claim 1, wherein the etching amount calculating step is a step of setting a plurality of arbitrary areas obtained by partitioning the semiconductor substrate by an arbitrary size and calculating an etching amount for each of the arbitrary areas.

4. The method according to claim 1, wherein the growth layer thickness measuring step is a step of measuring the thickness of the growth layer using Fourier transform infrared spectroscopy.

5. The method according to claim 1, wherein the growth layer thickness measuring step is a step of measuring the thickness of the growth layer using Raman spectroscopy.

6. The method according to claim 1, wherein the semiconductor substrate is silicon carbide.

* * * * *